United States Patent [19]
Zyung et al.

[11] Patent Number: 6,150,187
[45] Date of Patent: Nov. 21, 2000

[54] ENCAPSULATION METHOD OF A POLYMER OR ORGANIC LIGHT EMITTING DEVICE

[75] Inventors: Tae Hyoung Zyung; Do Hoon Hwang; Sang Don Jung, all of Daejeon, Rep. of Korea

[73] Assignee: Electronics and Telecommunications Research Institute, Daejeon, Rep. of Korea

[21] Appl. No.: 09/122,755

[22] Filed: Jul. 27, 1998

[30] Foreign Application Priority Data

Nov. 20, 1997 [KR] Rep. of Korea ................. 97-61582

[51] Int. Cl.⁷ .................... H01L 21/00; H01L 21/44; H01L 21/48; H01L 21/50
[52] U.S. Cl. ................... 438/26; 438/28; 438/126
[58] Field of Search .................... 438/116, 126, 438/127, 761, 780, 902, 928, 956, 28, 35, 26, 22; 257/79, 99, 100, 680, 790

[56] References Cited

U.S. PATENT DOCUMENTS

| | | |
|---|---|---|
| 4,967,117 | 10/1990 | Yoshioka et al. . |
| 5,107,175 | 4/1992 | Hirano et al. . |
| 5,312,706 | 5/1994 | Springett ................................. 430/58 |
| 5,463,229 | 10/1995 | Takase ................................. 257/59 |
| 5,516,727 | 5/1996 | Broom ................................. 437/211 |
| 5,686,360 | 11/1997 | Harvey ................................. 437/211 |
| 5,693,956 | 12/1997 | Shi ................................. 257/40 |
| 5,800,911 | 9/1998 | Sankey ................................. 428/213 |
| 5,811,177 | 9/1998 | Shi ................................. 428/209 |
| 5,895,228 | 4/1999 | Biebuyck ................................. 438/99 |
| 5,909,081 | 6/1999 | Eida ................................. 313/504 |
| 6,023,073 | 2/2000 | Strite ................................. 257/40 |

*Primary Examiner*—Charles Bowers
*Assistant Examiner*—Nema Berezny
*Attorney, Agent, or Firm*—Antonelli, Terry, Stout & Kraus, LLP

[57] ABSTRACT

The present invention relates to the encapsulation for extending the lifetime of a flexible organic or polymer light emitting device and, more particularly, to encapsulation by sealing with multiple polymer films to prevent the penetration of oxygen and moisture into an organic or polymer light emitting device. Due to the encapsulation of polymer light emitting device with the multiple polymer films, exposure to moisture and oxygen are prevented, which are causes of device degradation. When using a plastic substrate whose the thermal endurance is high, simultaneously, it has a thermal endurance effect to the Joule heat during device operation. Accordingly, there can be fabricated an organic or polymer light emitting display whose lifetime is extended through the encapsulation of an organic of polymer light emitting device with multiple polymer films.

7 Claims, 2 Drawing Sheets

ENCAPSULATION METHOD OF A POLYMER OR ORGANIC LIGHT EMITTING DEVICE

BACKGROUND OF THE INVENTION

1. Field of the Invention

The present invention relates to an encapsulation method of a polymer or organic light emitting device and, more particularly, to an encapsulation method of a polymer or organic light emitting device using multiple polymer layers.

2. Description of the Prior Art

Generally, in a conventional encapsulation method of packaging a light emitting device and display device, it is well known to perform such packaging by using of an inorganic matter, there is not used an encapsulation method by use of an organic or polymer.

SUMMARY OF THE INVENTION

It is an object of the present invention to increase the lifetime of a device by it from oxygen and moisture in the air which penetrate into a device and cause the organic or polymer light emitting device to be degraded.

In order to accomplish the above object, the present invention provides an encapsulation method of a polymer or organic light emitting device, wherein the method comprises steps of:

forming an organic or polymer light emitting device on a transparent substrate; wrapping the device with multiple polymer multiple films to protect the organic or polymer light emitting device from oxygen and moisture.

In one aspect of the present invention, the lifetime of the device is to be extended without having an effect on any mechanical physical property of a flexible light emitting device due to the encapsulation of the light emitting device using multiple polymer multiple films having a permeability of an oxygen and reduced moisture.

It is known that the lifetime of an organic or polymer light emitting device is greatly influenced by oxygen and moisture in the air. Accordingly, there has been studied the characteristics of such a device in an inert atmosphere such as a vacuum. To realize the light emitting device, it is necessary that the device should be protected from oxygen or moisture in the air. However, it is not easy to shield the device from oxygen or moisture in the air, and therefore it has not been studied well. The present invention intends to prevent the penetration of oxygen or moisture into an organic or polymer light emitting device by an encapsulation of the light emitting device around the device utilizing multiple polymer thin films having low transmitability of oxygen or moisture.

In another aspect of the present invention, the present invention provides an encapsulation method of a polymer or organic light emitting device on a flexible transparent plastic substrate as multiple polymer films shield the device from oxygen and moisture.

BRIEF DESCRIPTION OF THE DRAWINGS

The above and other objects and features of the present invention will become apparent from the following description of preferred embodiments, when taken in conjunction with the accompanying drawings, in which.

DETAILED DESCRIPTION OF THE PREFERRED EMBODIMENTS

Hereinafter, the embodiment of the present invention will be explained in detail with reference to the drawings attached.

Figure 1:
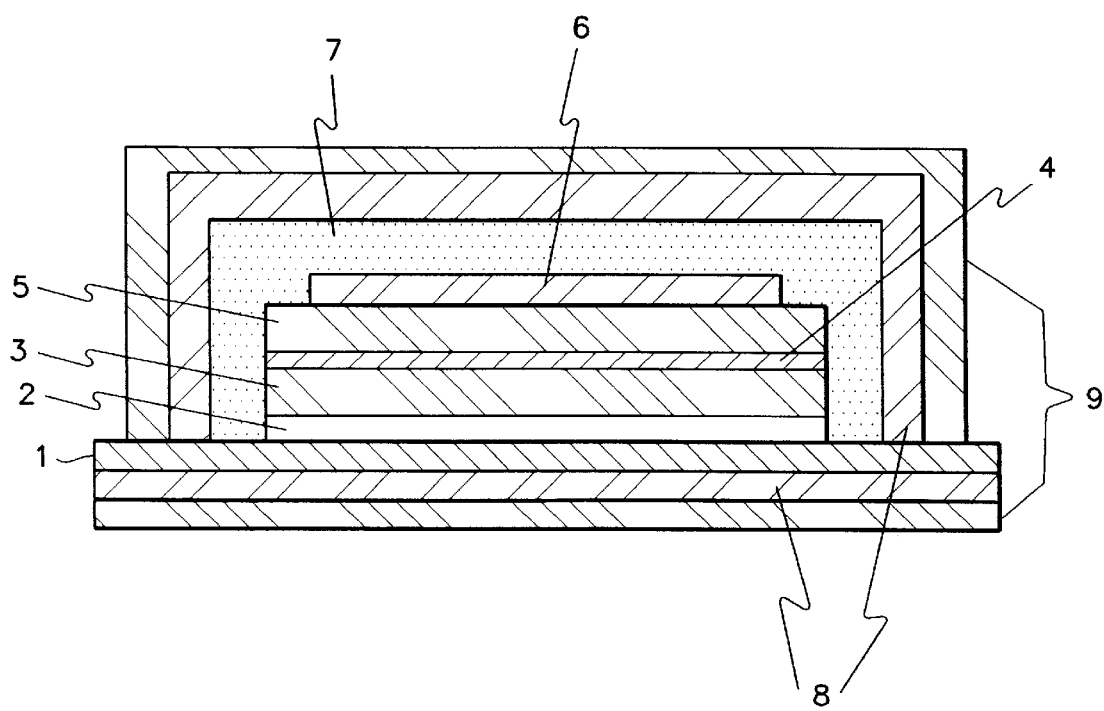
FIG. 1 is a sectional view of an encapsulation of an organic or polymer light emitting device with multiple polymer films.
Figure 2:
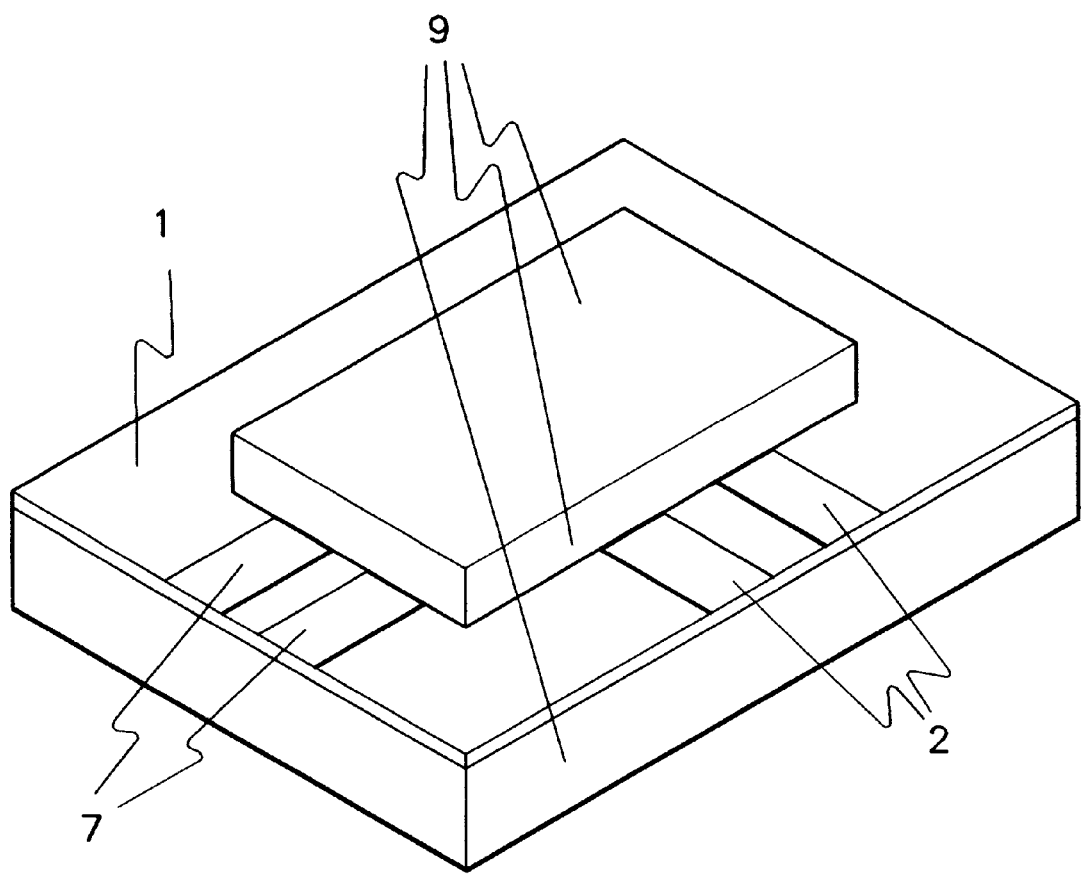
FIG. 2 is a top view of an encapsulation of an organic or polymer light emitting device with multiple polymer films.

FIG. 1 is a sectional view showing an encapsulated structure of an organic or polymer light emitting device with multiple polymer films, FIG. 2 is a schematic perspective view of FIG. 1.

FIGS. 1 and 2 illustrate a transparent plastic substrate 1, a transparent electrode 2, a charge transport layer 3, an organic or polymer light emitting light layer 4, a charge transport layer 5, a metallic electrode for a cathode 6, a simultaneous oxygen and moisture protection protecting layer 7, an oxygen protecting layer 8, and a moisture protecting layer 9 respectively.

As shown in FIG. 1, the present invention comprises a simultaneous oxygen and moisture shielding layer 7, an oxygen shielding layer 8, and a moisture shielding layer 9, to wrap an upper overall surface of a light emitting device which is integrated sequentially as follows: a transparent plastic substrate 1, a transparent electrode 2 having a constant patterned width on the substrate 1, a charge transport layer 3, an organic or polymer light emitting layer 4, a charge transport layer 5, a metallic electrode for a cathode 6, and oxygen and moisture protecting layers 8, 9 being formed on a back overall surface of the substrate.

Hereinafter, there will be explained an encapsulation method of the present invention having the construction as set forth above.

First, there is formed a transparent electrode 2 on the transparent plastic substrate 1. Conventionally, there is widely used a polyethylene terephthalate (PET) as the transparent plastic substrate. However, in the present invention, there is used a plastic thin layer of transparent polyethyl naphthalate (PEN) derivatives having oxygen and moisture permeability which is very low, or a rubber film of transparent and flexible polyurethane derivatives also having low oxygen and moisture permeability.

There is conventionally formed inorganic indium tin oxide use as a transparent electrode 2 by means of a low temperature deposition. In the present invention, there is used a polymer of conductive polyaniline, polythiophene derivatives as the polymeric materials by means of a spin coating. The transparent electrode can be formed by various kinds of patterns by means of a well-known pattern process as required.

Subsequently, there is formed a charge transport layer (hole transport layer) 3 of a polymer or organic materials on the transparent electrode 2 as required through a spin coating or a vacuum deposition. The thickness of this transport layer is 10–50 nm. The charge transport layer 3 functions to help the hole injection into a light emitting layer 4 from the transparent electrode 2 as a method to increase the luminous efficiency of the light emitting device.

Next, the polymer or organic light emitting layer 4 is formed on the charge transport layer 3 by a method of spin coating or vacuum deposition. The thickness of the light emitting layer 4 is 50–100 nm, and there can be used a polymer blend of which various emissive materials are compounded to emit various colors. The polymer or organic materials forming the light emitting layer has structural characteristic by which the delocalization of electrons occurs easily due to having a conjugated structure in the chemical structure.

Subsequently, the charge transport layer (electronic transport layer) 5 is formed on the light emitting layer 4 having a thickness of about 10–50 nm by using a method of vacuum deposition or spin coating as required. The charge transport layer 5 helps whereby electrons are injected into the light emitting layer 4 from a metallic electrode for a cathode 6 formed thereon, and functions as the injection of electrons from the metallic electrode 6 to the light emitting layer is more efficient due to blocking that the holes proceed from anode to cathode.

Next, after coating the charge transport layer 5, fabrication of the light emitting device is completed by forming the metallic electrode 6 to be used in the cathode by way of a vacuum deposition method. At this time, the metallic electrode 6 is formed using metals (Ca, Mg, or Al) having a low work function compared to the transparent electrode 2. In the case of the metal (Ca, Al) which is oxidized easily in the air, the oxidation can be prevented by coating due to the vacuum deposition of aluminum or gold etc. thereon. The metal electrode 6 can be used by a suitable pattern process, forming a pattern by means of a shadow mask, etc.

Subsequently, the simultaneous oxygen moisture protecting film 7 is formed to shield overall surface of the accomplished light emitting device from an exterior oxygen and moisture. At this time, the oxygen, moisture protecting film 7 is attached by use of an adhesive due to using the polymer film of polyethyl naphthalate (PEN) derivatives.

Next, an oxygen protecting film 8 is formed on the simultaneous oxygen and moisture protecting film 7 and the other surface of the transparent plastic substrate 1 as one of the multiple polymer films, attaching the existing film by an adhesive or a spin coating or a doctor blade method. The polymer of transparent polyvinyl alcohol or polyvinyl acetate derivatives is used as the oxygen protecting film 8.

Subsequently, the moisture protecting film 9 is formed as one of the polymer multiple layers on the oxygen protecting film 8 by a spin coating or doctor blade method, or the existing film is formed by use of an adhesive. The polymer of transparent polyethylene derivatives is used as the moisture protecting film 9.

The fabrication method should be performed in a vacuum or inert atmosphere. The thickness of the protecting film 8, 9 is 10–200 µm, the thickness of the transparent plastic substrate 1 should be 120 µm to maintain the transparency in the case of the film made of polyethyl naphthalate derivatives. An epoxy resin or the acryl series resin which can be hardened by ultraviolet is used as an adhesive.

As explained above, the encapsulation process according to the present invention, for protecting an organic or polymer light emitting device from an oxygen or moisture, forms a polymer protecting film by employing a spin coating or doctor blade method or by attaching a conventional protecting film by an adhesive.

In developing an organic or polymer light emitting display according to the present invention, for preventing penetration by oxygen or moisture in an air using the polymer multiple film, firstly, to increase the lifetime of the device, secondly, the fabricating process can be simplified by a spin coating, and a method of using an adhesive, as a result, there can be an encapsulation of a display device which comes by a low fabricating price and easy manufacture process. Thirdly, it does not damage the mechanical flexibility of an organic or polymer light emitting display device by use of the polymer multiple film, therefore, it has an effect that there increases the possibility of fabricating a wall-hanger TV screen in the form of roll. Fourthly, it is possible to fabricate a large-area flat panel display.

As described above, although the present invention has been described in detail with reference to illustrative embodiments, the invention is not limited thereto and various modifications and changes may be effected by one skilled in the art within the scope of the invention.

What is claimed is:

1. An encapsulation method of a polymer or organic light emitting device, said method comprising the steps of:

forming an organic or polymer light emitting device having a metal layer serving as a metallic electrode, on a transparent substrate; and wrapping said device with multiple polymer films without contacting said metal layer to protect said organic or polymer light emitting device from oxygen and moisture.

2. The encapsulation method of a polymer or organic light emitting device according to claim 1, wherein said multiple polymer films are formed by integrating a simultaneous oxygen and moisture preventing film, an oxygen preventing film and a moisture preventing film in series.

3. The encapsulation method of polymer or organic light emitting device according to claim 1, wherein said transparent substrate includes a polymer of polyethyl naphthalate derivatives.

4. The encapsulation method of a polymer or organic light emitting device according to claim 1, wherein said transparent substrate includes a thin rubber film of polyurethane derivatives.

5. The encapsulation method of a polymer or organic light emitting device according to claim 2, wherein said simultaneous oxygen and moisture preventing film includes a polymer of polyethyl naphthalate derivatives.

6. The encapsulation method of a polymer or organic light emitting device according to claim 2, wherein said oxygen preventing film includes one of the polymer thin films which include polyvinyl alcohol derivatives, polyvinyl acetate derivatives, polyvinyl alcohol acetate derivatives and is formed by a spin coating, doctor-blading or by attaching film with an adhesive.

7. The encapsulation method of polymer or organic light emitting device according to claim 2, wherein said moisture preventing film includes a polymer thin film of polyethylene derivatives and is formed by spin coating, doctor-blading, or by attaching film with an adhesive.

* * * * *